(12) United States Patent
Konno

(10) Patent No.: US 6,809,677 B2
(45) Date of Patent: *Oct. 26, 2004

(54) ANALOG TO DIGITAL CONVERTER SELECTING REFERENCE VOLTAGES IN ACCORDANCE WITH FEEDBACK FROM PRIOR STAGES

(75) Inventor: Takashi Konno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/788,290

(22) Filed: Mar. 1, 2004

(65) Prior Publication Data

US 2004/0164890 A1 Aug. 26, 2004

Related U.S. Application Data

(63) Continuation of application No. 09/983,658, filed on Oct. 25, 2001, now Pat. No. 6,700,523.

(51) Int. Cl.[7] .............................. H03M 1/34; H03M 1/38
(52) U.S. Cl. ...................................... 341/161; 341/158
(58) Field of Search ................................ 341/161, 158, 341/118, 120, 155; 327/96

(56) References Cited

U.S. PATENT DOCUMENTS

| | | | |
|---|---|---|---|
| 4,611,196 A | 9/1986 | Fernandez | 341/158 |
| 4,665,382 A | 5/1987 | Morgan | 341/122 |
| 4,769,628 A | 9/1988 | Hellerman | 341/162 |
| 5,283,583 A | 2/1994 | Ichihara | 341/162 |
| 5,353,027 A | 10/1994 | Vorenkamp et al. | 341/156 |
| 6,104,332 A | 8/2000 | Brandt | 341/156 |
| 6,359,579 B1 | 3/2002 | Chiang | 341/155 |
| 6,384,757 B1 | 5/2002 | Kosonen | 341/120 |
| 6,396,429 B2 * | 5/2002 | Singer et al. | 341/155 |
| 6,437,608 B1 * | 8/2002 | Miyabe et al. | 327/96 |
| 6,700,523 B2 * | 3/2004 | Konno | 341/161 |

FOREIGN PATENT DOCUMENTS

| | | |
|---|---|---|
| EP | 1085658 | 3/2001 |
| JP | 05-152960 | 6/1983 |
| JP | 10-178345 | 6/1989 |
| JP | 2000-031826 | 1/2000 |

* cited by examiner

Primary Examiner—Patrick Wamsley
(74) Attorney, Agent, or Firm—Volentine Francos & Whitt, PLLC

(57) ABSTRACT

An A/D converter includes first to $N_{th}$ stages of A/D conversion units, which are connected in series, each A/D conversion unit converting an analog input signal into a digital output signal. Each of the A/D conversion units includes a) a sample-and-hold circuit, which holds an analog input signal; b) a selector which selects one from a plurality of reference voltage signals in accordance with a digital output signal outputted from the one stage preceding A/D conversion unit; and c) a comparator which compares an output signal supplied from the sample-and-hold circuit with the reference voltage signal selected by the selector.

7 Claims, 11 Drawing Sheets

TRANSIENT RESPONSE

US 6,809,677 B2

ANALOG TO DIGITAL CONVERTER SELECTING REFERENCE VOLTAGES IN ACCORDANCE WITH FEEDBACK FROM PRIOR STAGES

CROSS REFERENCE TO RELATED APPLICATIONS

This is a continuation application of application Ser. No. 09/983,658, filed Oct. 25, 2001, now U.S. Pat. No. 6,700,523, which is hereby incorporated by reference in its entirety for all purposes.

TECHNICAL FIELD OF THE INVENTION

The present invention relates to an A/D (Analog to Digital) converter, which converts an analog signal into a digital signal.

BACKGROUND OF THE INVENTION

Two types of typical A/D converters, successive approximation A/D converter and pipelined A/D converter, have been proposed and used.

According to a conventional successive approximation A/D converter, it is necessary to spend at least N cycles to obtain N-bit digital data. Therefore, it is difficult to provide a fast operating A/D converter.

According to a conventional pipelined A/D converter, a large number of analog circuits must be used, so that it is required to increase a dimension of each transistor in order to provide higher accuracy. As a result, the scale of circuitry becomes larger.

OBJECTS OF THE INVENTION

Accordingly, it is an object of the present invention to provide an A/D converter which operates at a high speed as compared with a conventional successive approximation A/D converter.

Another object of the present invention is to provide an A/D converter which can be designed to have a smaller scale of circuitry.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an A/D converter includes first to $N_{th}$ stages of A/D conversion units, which are connected in series, each A/D conversion unit converting an analog input signal into a digital output signal. Each of the A/D conversion units includes a) a sample-and-hold circuit, which holds an analog input signal; b) a selector which selects one from a plurality of reference voltage signals in accordance with a digital output signal outputted from the one stage preceding A/D conversion unit; and c) a comparator which compares an output signal supplied from the sample-and-hold circuit with the reference voltage signal selected by the selector.

According to a second aspect of the present invention, the A/D converter according to the first aspect further includes a flash A/D conversion unit of m-bit flash type, where "m" is smaller than "N". The flash A/D conversion unit comprises a m-bit flash A/D conversion circuit; a sample and hold circuit which holds an analog input signal; and m*(N−m) pieces of flip-flop circuits, in which each of serially connected (N−m) pieces of flip-flop circuits form a line so that "m" lines of (N−m) flip-flop circuits are connected in parallel to output terminals of the m-bit flash A/D conversion circuit.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
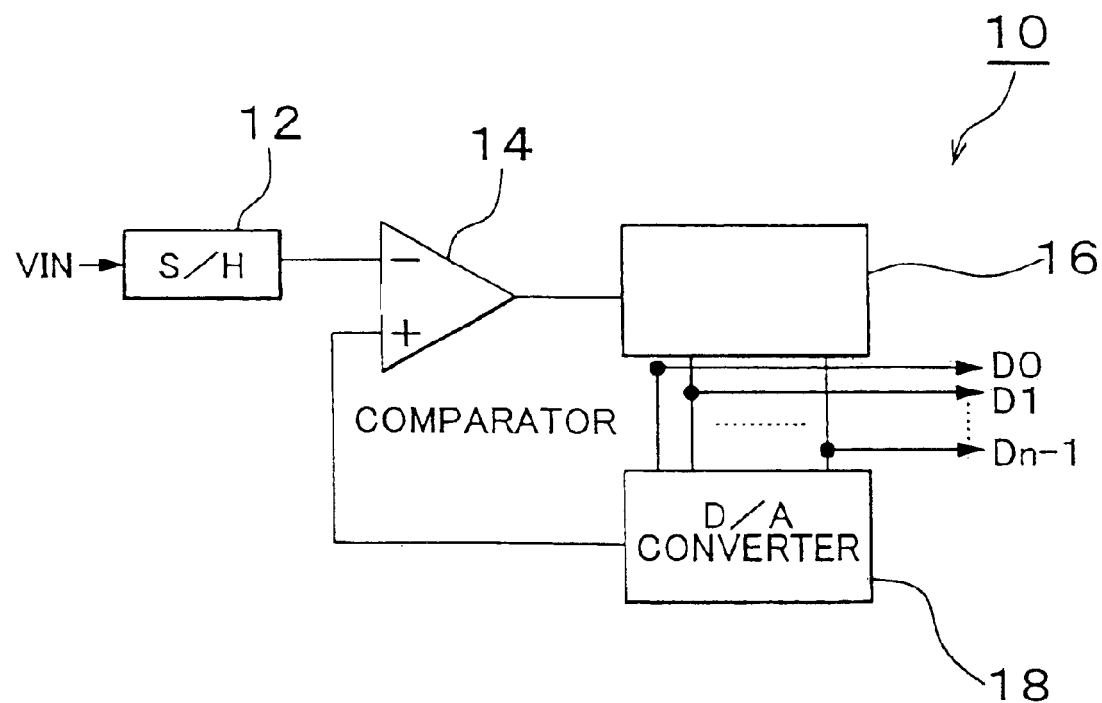
FIG. 1 is a block diagram showing a conventional successive approximation A/D converter.

For better understanding of the present invention, a conventional technology is first described. FIG. 1 is a block diagram showing a conventional successive approximation A/D converter 10. The A/D converter 10, which is of N-bit type, includes a sample-and-hold (S/H) circuit 12; a comparator 14; a successive approximation register (SAR) 16; and a D/A converter 18. The sample-and-hold circuit 12 is supplied at an input terminal with an input voltage signal VIN, and is connected at an output terminal to an input terminal of the comparator 14. The comparator 14 is connected at the other input terminal to an output terminal of the D/A converter. 18. The comparator 14 is connected at an output terminal to an input terminal of the successive approximation register (SAR) 16. The successive approximation register (SAR) 16 is connected at output terminals to input terminals of the D/A converter 18. The successive approximation register (SAR) 16 supplies N-bit digital output signals.

For easy understanding, the operation of the conventional A/D converter 10 will be described for the case in which 3-bit signal is processed, a 1.3V of analog input signal VIN is used and an upper limit of conversion is 2.0V. First, the analog input signal VIN of 1.3V is sampled and held at the S/H circuit 12. In a conversion mode, at the first cycle, the successive approximation register (SAR) 16 outputs a 3-bit of digital signal "100". The D/A converter 18 converts the digital signal "100" into a corresponding analog signal. In this case, the D/A converter 18 supplies an analog signal corresponding to a half of the conversion upper limit of conversion for the A/D converter 10, which is 1.0V.

The comparator 14 compares the analog input signal, held at the S/H circuit 12, with an output signal of the D/A converter 18. According to the comparison, when the analog input signal VIN is larger than the output signal of the D/A converter 18, the comparator 14 outputs "1". On the other hand, when the analog input signal VIN is smaller than the output signal of the D/A converter 18, the comparator 14 outputs "0". Such an output signal of the comparator 14 is supplied to the successive approximation register (SAR) 16. In this case, the analog input signal VIN (=1.3V) is larger than the output signal (=1.0V) of the D/A converter 18, so that the comparator 14 outputs "1". As a result, a MSB (Most Significant Bit) of the A/D converter 10 is determined to be "1".

In the next cycle, the successive approximation register (SAR) 16 outputs "110", which is to be converted into an analog signal by the D/A converter 18. The analog signal is to be 1.5V, which is ¾ of the upper limit of conversion (2.0V) of the A/D converter 10. After that, the same operation as described above is repeated. The analog input signal VIN (=1.3V) is smaller than the output signal (=1.5V) of the D/A converter 18, so that the comparator 14 outputs "0" as the second bit.

In the next cycle, the successive approximation register (SAR) 16 outputs "101", so that the D/A converter 108 outputs an analog signal of 1.25V. In this case, the analog input signal VIN (=1.3V) is larger than the output signal (=1.25V) of the D/A converter 18, so that the comparator 14 outputs "1" as a LSB (Least Significant Bit). Therefore, a three bit digital output signal of "101" is supplied out of the A/D converter 10, and the conversion process is completed.

According to the above-described conventional A/D converter 10, it is necessary to spend at least N cycles to obtain N-bit digital data. Therefore, it is difficult to provide a fast operating A/D converter.

Figure 2:
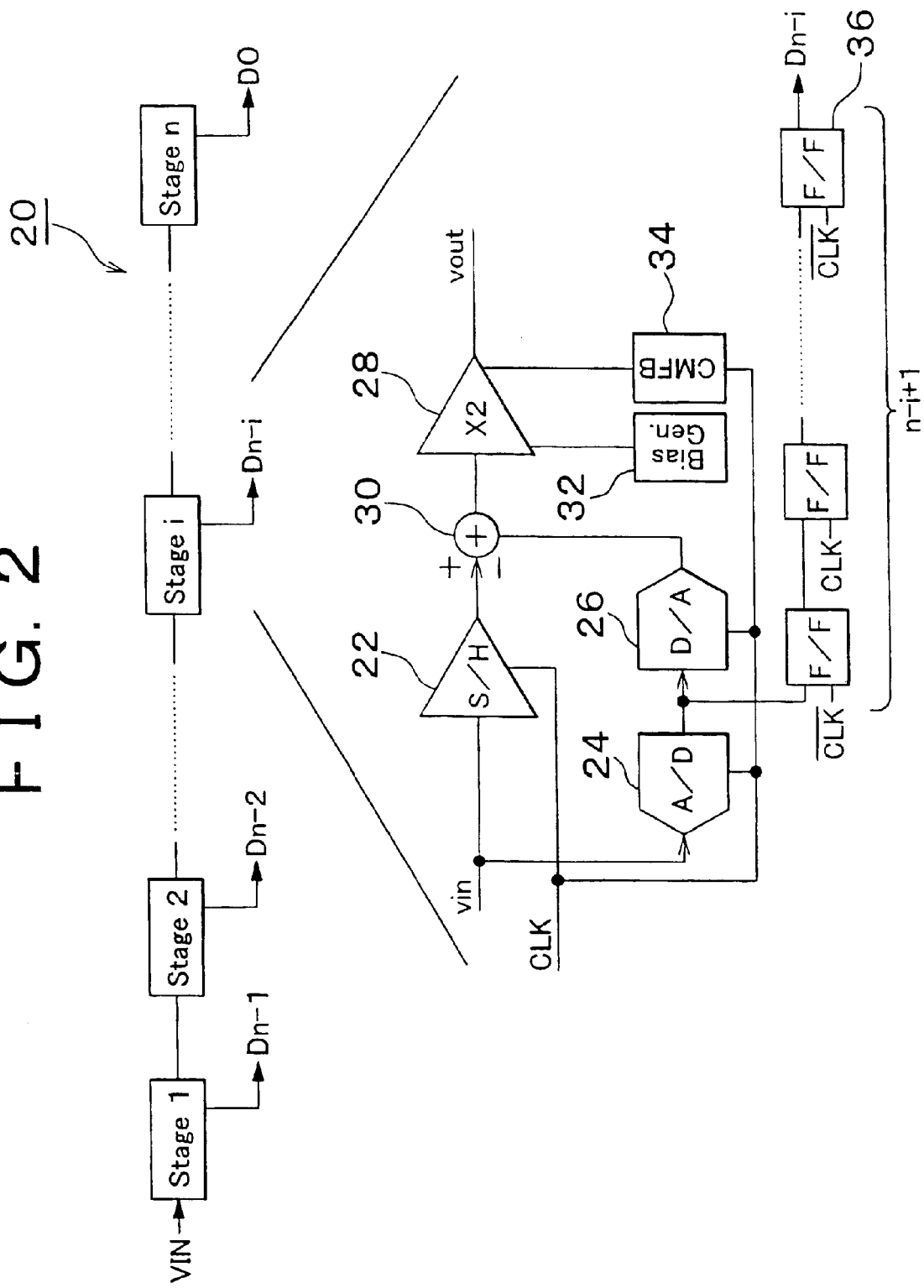
FIG. 2 is a block diagram showing a conventional pipelined A/D converter.

FIG. 2 is a block diagram showing a conventional N-bit pipelined A/D converter 20. The A/D converter 20 includes first to $N_{th}$ stages of A/D conversion units, which are pipeline-connected in series. The first to $N_{th}$ stages of A/D conversion units have the same configuration, so only $i_{th}$ stage of A/D conversion unit is described on behalf of the other units. The $i_{th}$ A/D conversion unit includes a sample-and-hold (S/H) circuit 22; an A/D circuit 24; a D/A circuit 26; a double amplifier 28; an adder 30; a bias generating circuit 32; a common mode feedback (CMFB) circuit 34; and serially connected first to (n-i+1)th flip-flop circuits 36. The bias generating circuit 32 generates a bias voltage to be supplied to the amplifier 28. S/H circuit 22 supplied with an analog input signal VIN.

The S/H circuit is supplied with an analog input signal vin and with a clock signal CLK. The S/H circuit is connected at an output terminal to an input terminal of the adder 30. The A/D circuit 24 is supplied with the analog input signal vin and with the clock signal CLK. The A/D circuit 24 is connected at an output terminal to an input terminal of the D/A circuit 26 and to an first flip-flop circuit 36. The D/A circuit 26 is supplied with the clock signal CLK, and is connected at an output terminal to the other input terminal of the adder 30. The adder 30 is connected at an output terminal to an input terminal of the amplifier 28. The amplifier 28 is connected at input terminals to output terminals of the bias generating circuit 32 and CMFB circuit 34.

For easy understanding, the operation of the conventional A/D converter 20 will be described for the case in which 3-bit signal is processed, a 1.3V of analog input signal VIN is used and an upper limit of conversion is 2.0V. First, in the stage 1, the analog input signal VIN of 1.3V is sampled and held by the S/H circuit 22, and at the same time, is supplied to the A/D converter 24. The A/D converter 24 is of one-bit type to supply a digital output signal of "1" when the analog input signal VIN is larger than 1.0V and to supply a digital output signal of "0" when the analog input signal VIN is smaller than 1.0V. The D/A converter is also of one-bit type to supply an analog output signal of 1.0V when the digital input signal is "1" and to supply an analog output signal of 0.0V when the digital input signal is "0".

In this case, the analog input signal VIN (=1.3V) is larger than 1.0V, the A/D converter 24 outputs a digital signal of "1", which is to be a MSB for the whole the system 20. In the first stage of converter unit, the D/A converter 26 outputs an analog signal of 1.0V. The X2-amplifier 28 doubles 0.3V, which is given by subtracting 1.0V from the output signal 1.3V of the S/H circuit 22, to obtain an analog signal of 0.6V. The analog signal of 0.6V is to be an output signal vout of the first stage of conversion unit.

In the second stage of conversion unit, in response to an analog input signal of 0.6V, a digital signal of "0" is provided. Next, the analog input signal 0.6V is added with 0.0V and then is doubled to obtain an output signal vout of 1.2V. In the same manner, in the third (last) stage of conversion unit, a digital signal of "1" is generated in response to an analog input signal of 1.2V. The digital signal "1" is to be a LSB of the whole system 20. At the end of conversion process, a three-bit output signal of "101" is obtained from the analog input signal of 1.3V.

According to the above-described A/D converter 20, a large number of analog circuits must be used, so that it is required to increase a dimension of each transistor in order to provide higher accuracy. As a result, the scale of circuitry becomes larger.

Figure 3:
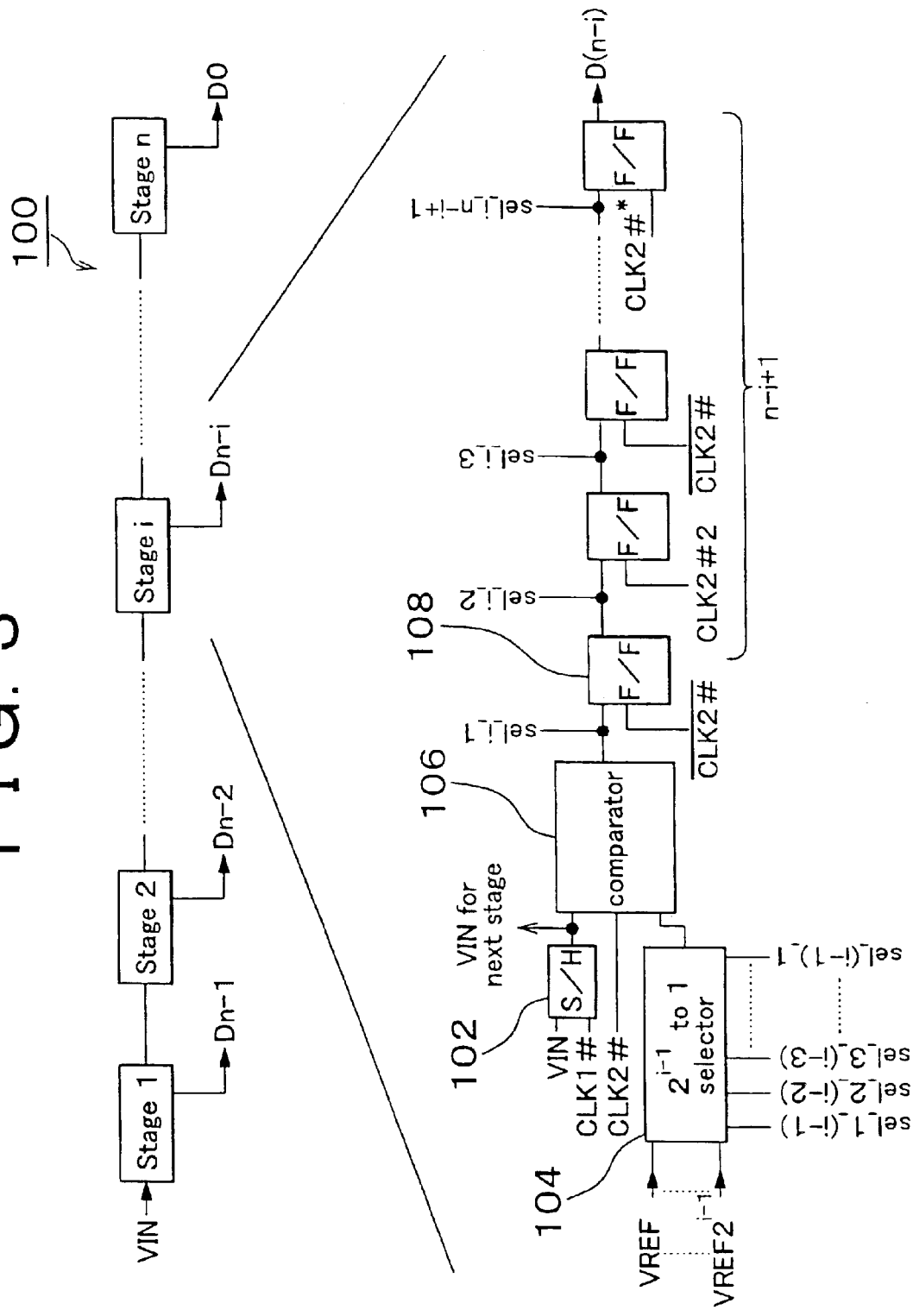
FIG. 3 is a block diagram showing an A/D converter according to a first preferred embodiment of the present invention.

FIG. 3 is a block diagram showing an A/D converter 100 according to a first preferred embodiment of the present invention. The A/D converter 100 includes first to $N_{th}$ stages of A/D conversion units, which are connected in series, each A/D conversion unit converting an analog input signal into a digital output signal in synchronization with a clock signal CLK1 and CLK2. Each of the A/D conversion units includes a sample-and-hold (S/H) circuit 102, which samples and holds an analog input signal VIN in synchronization with the clock signal CLK1; a selector 104 which selects one from a plurality of reference voltage signals VREF1 to VREF$2^{i-1}$ in accordance with a digital output signal outputted from the one stage preceding A/D conversion unit; and a comparator 106 which compares an output signal supplied from the S/H circuit 102 with the reference voltage signal selected by the selector 104 to generate a digital output signal thereof.

In $i_{th}$ stage of A/D conversion unit, the selector 104 selects one reference voltage signal from $2^{i-1}$ pieces of reference voltage signals. Each stage of conversion unit also includes serially connected flip-flop circuits 108, which delays an output signal of the comparator 106 by necessary cycles. In $i_{th}$ stage of A/D conversion unit, (N−i+1) pieces of flip-flop circuits are used to which an output signal of the comparator 106 in the one stage preceding A/D conversion unit is supplied. An output signal of the comparator 106 for the one stage preceding A/D conversion unit is supplied to the selector 104 therein. The even-numbered stages of A/D conversion units and odd-numbered stages of A/D conversion units operate in synchronization with clock signals having the opposite phases.

In each stage of conversion unit, the S/H circuit 102 is supplied with the analog input signal VIN and clock signal CLK1#, and is connected at an output terminal to an input terminal of the comparator 106 and to an input terminal of a S/H circuit (102) in the next stage. The selector 104 is supplied with reference voltage signals VREF1 to VREF$2^{i-1}$ and selections signals sel_1_(i−1) to sel_(i−1)_1, and is connected at an output terminal to an input terminal of the comparator 106. The comparator 106 is supplied with a clock signal CLK#2, and is connected to an input terminal of a first flip-flop circuit 108. Input signals supplied to the flip-flop circuits 108 are used as selecting signals sel_1_ (i−1) to sel_(i−1)_1 for the next stage.

Figure 4:
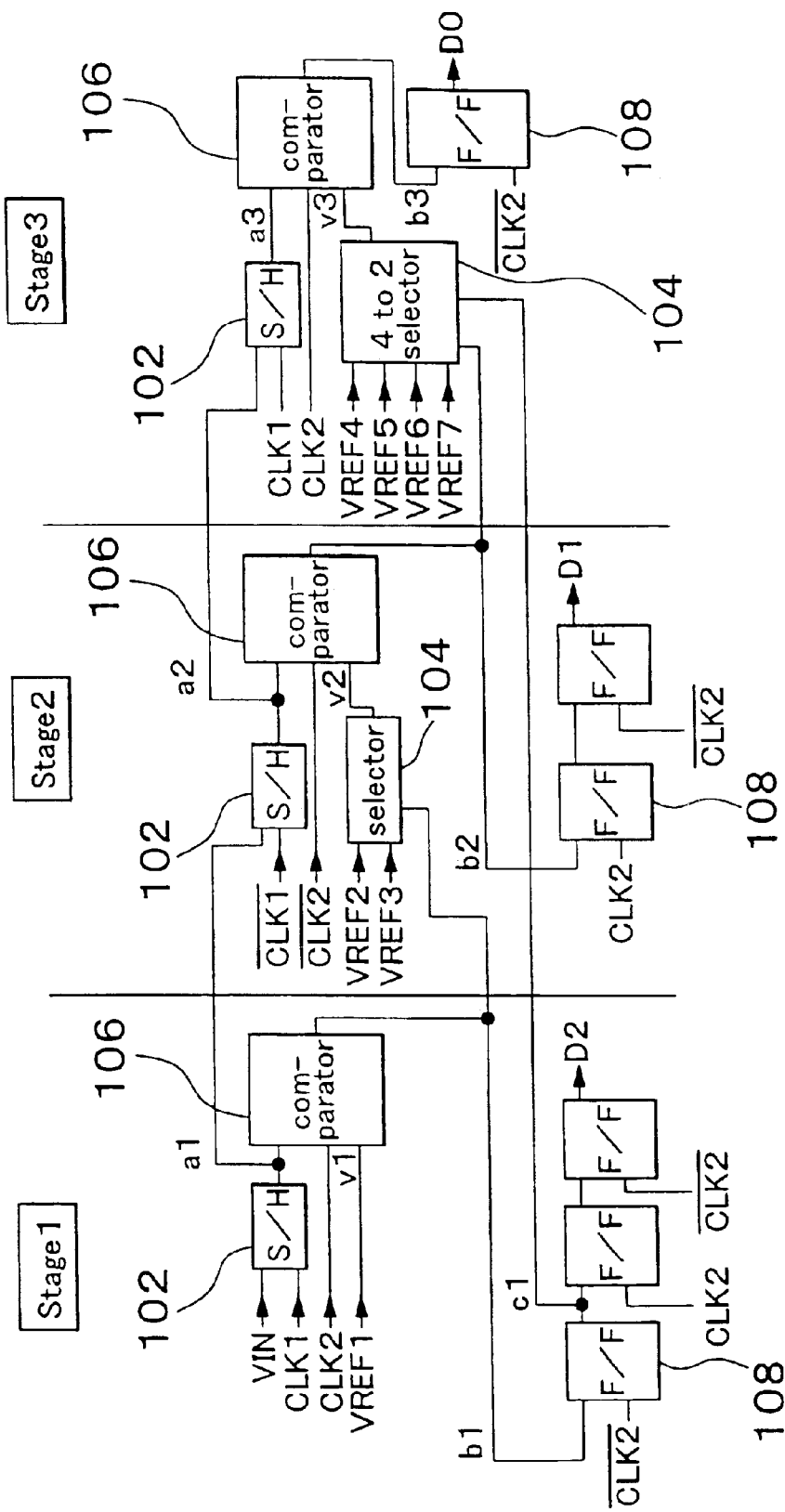
FIG. 4 is a block diagram showing a three-bit type of A/D converter according to the first preferred embodiment.
Figure 5:
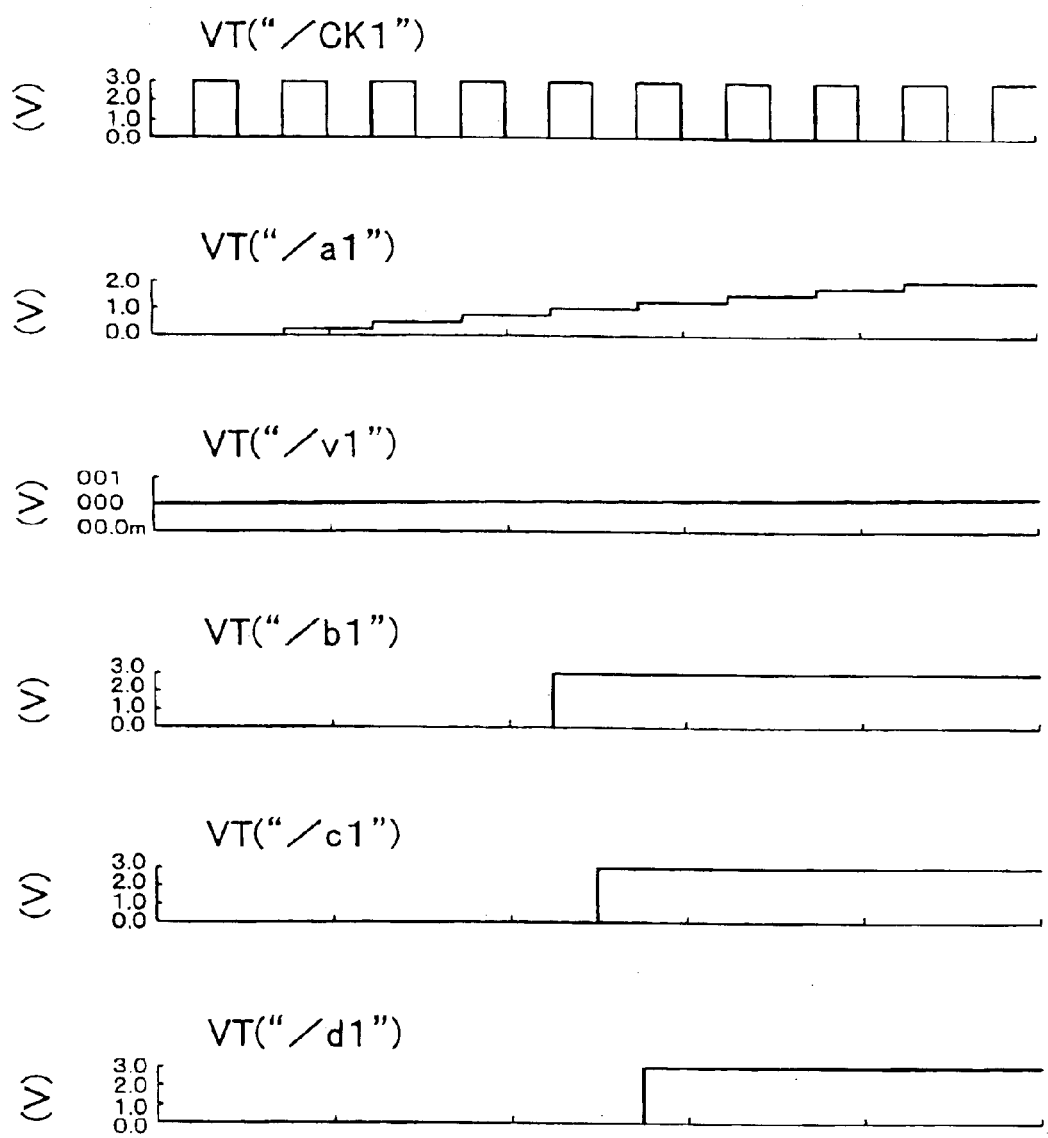
FIGS. 5 to 8 are graphs showing operation of the first preferred embodiment.
Figure 6:
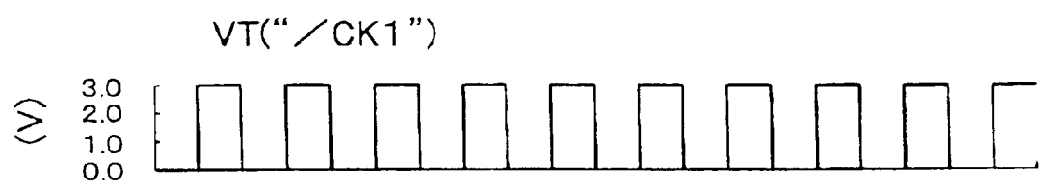
Figure 6:
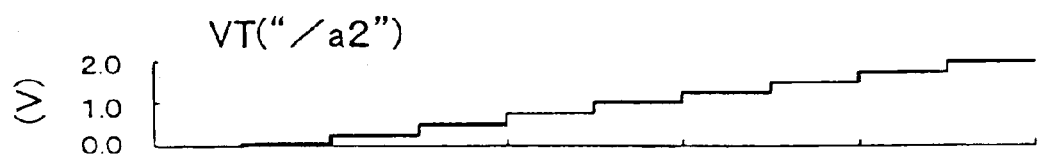
Figure 6:
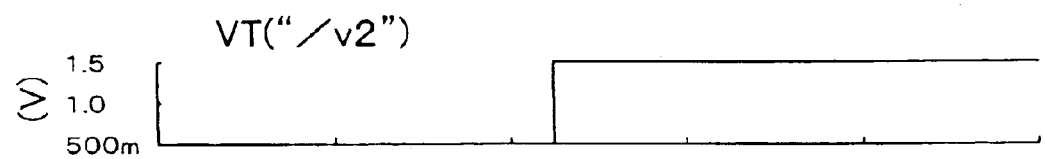
Figure 6:
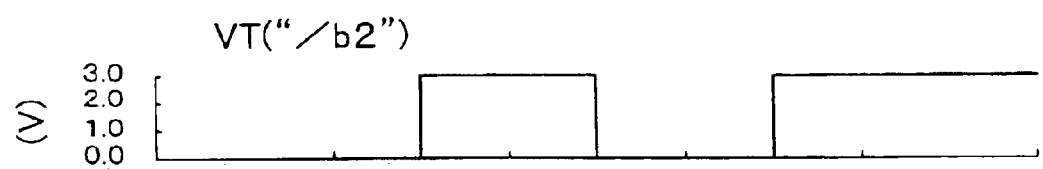
Figure 6:
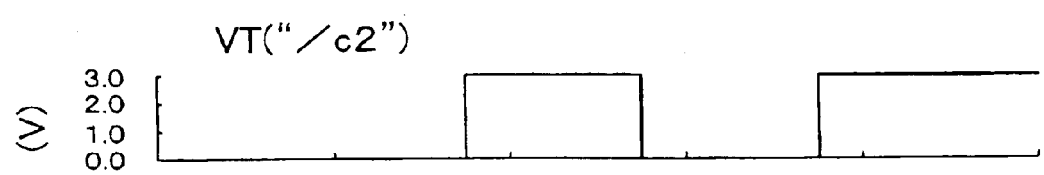
Figure 7:
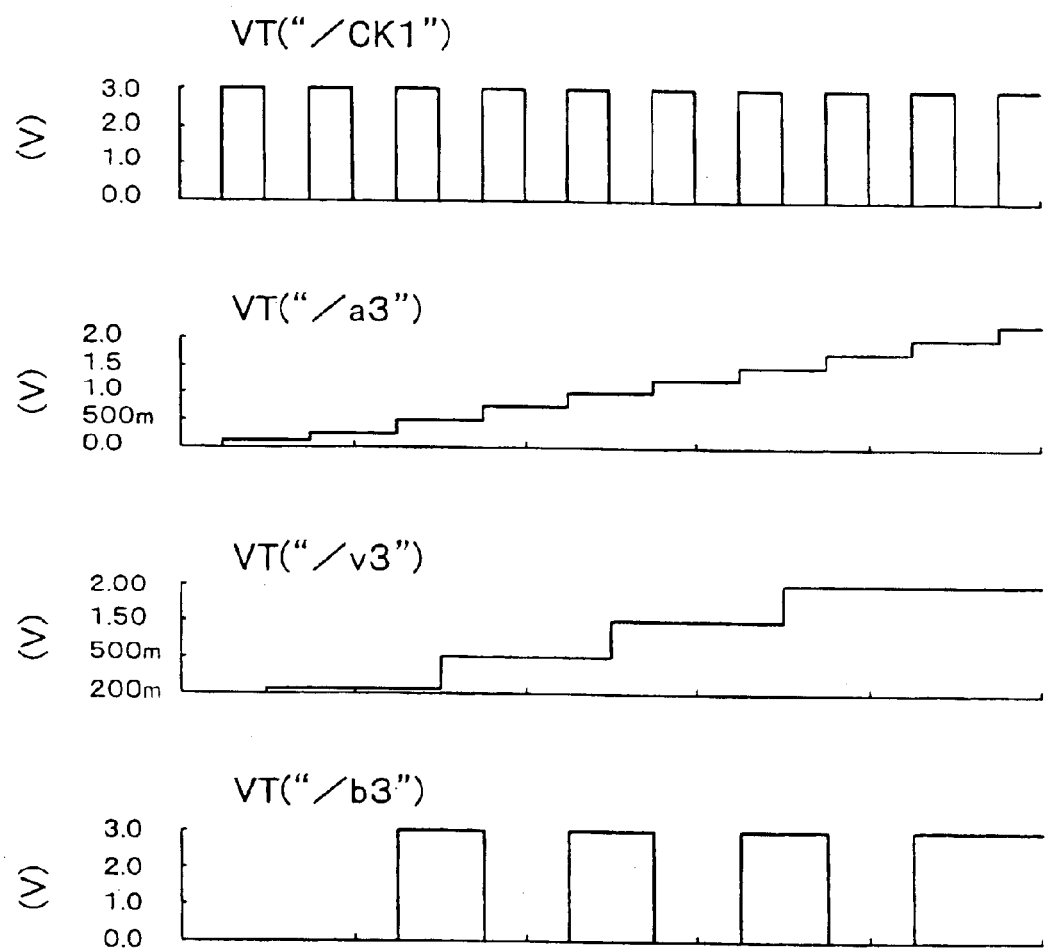
Figure 8:
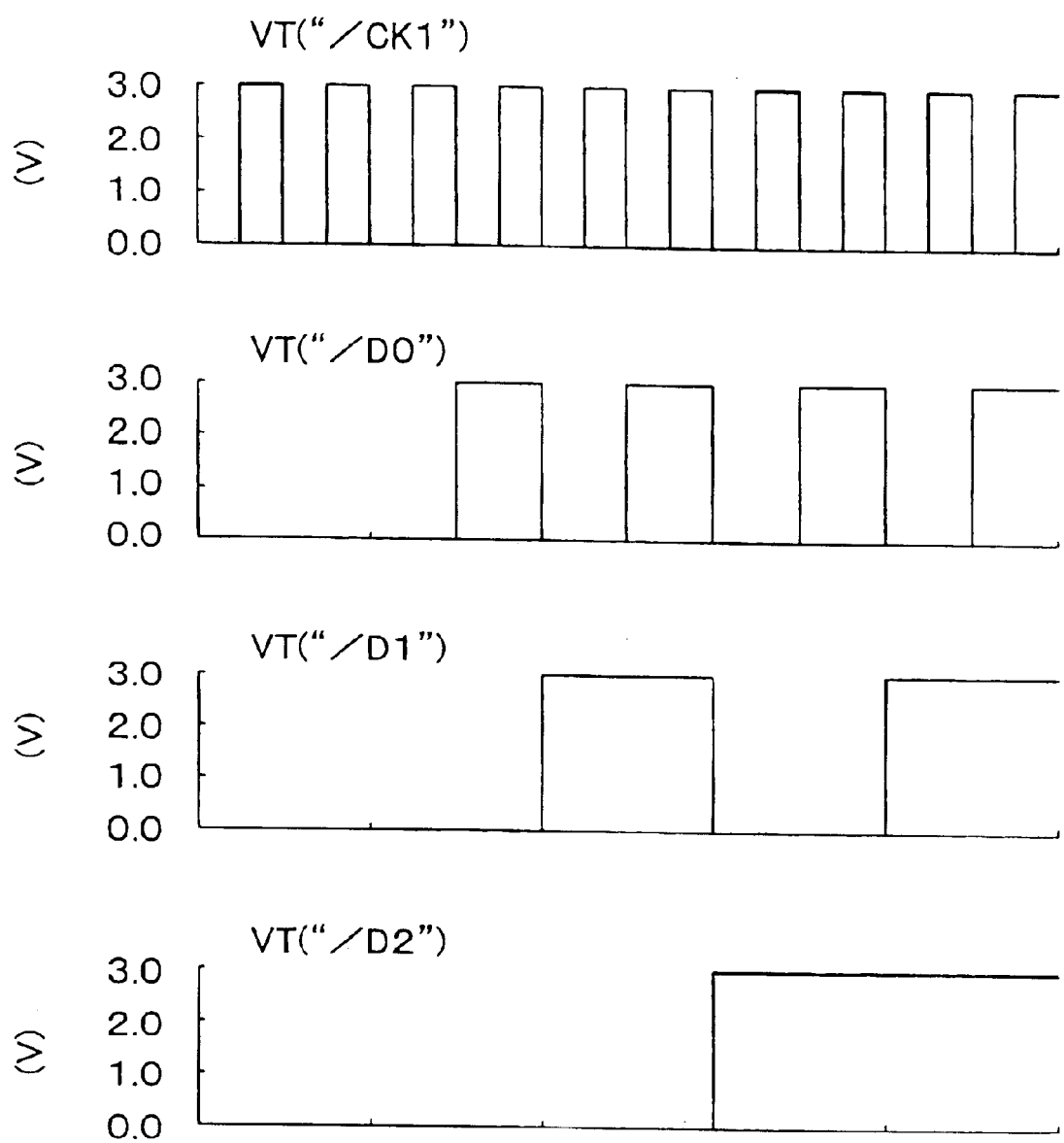

For easy understanding, the operation of the A/D converter 100 is described assuming that the converter treats three-bit signal (N=3) in reference to FIG. 4. First in the first stage "Stage1", an analog input signal VIN (=1.3V) is sampled and held by the S/H circuit 102 at a rising point of the clock signal CLK1, so that a node a1 is maintained at 1.3V. The comparator 106 in the stage 1 is supplied with a reference voltage VREF1 of 1.0V. The comparator 106 compares the voltage at the node a1 (1.3V) and the reference voltage VREF1 (1.0V) at a rising point of the clock signal CLK2, and supplies an output signal b1 of "1".

Next, in the second stage "Stage2", the S/H circuit 102 samples and holds a voltage (1.3V) at the node a1 in the first stage "Stage1" at a dropping point of the clock CLK1. A node a2 is maintained at 1.3V. The comparator 106 in the second stage "Stage2" is supplied with reference voltage signals VREF2=0.5V and VREF3=1.5V. In response to the output signal b1 of "1" of the comparator 106 in the first stage "Stage1", the reference voltage signal VREF3 (1.5V) is selected for the comparator 106 in the second stage "Steage2". As a result, a voltage signal of 1.5V is applied to a node v2. The comparator 106 in the second stage "Stage2" compares voltage 1.3V at the node a2 with voltage 1.5V at the node v2, and supplies an output signal b2 of "0".

After that, in the last stage "Stage3", the S/H circuit 102 samples and holds voltage 1.3V at the node a2 in the second stage "Stage2" at a rising point of the clock CLK1. A node a3 is maintained at 1.3V. The comparator 106 in the last stage "Stage3" is supplied with reference voltage signals. VREF4=0.25V, VREF5=0.75V, VREF6=1.25V and VREF7=1.75V. At this time, a node c1 in the first stage "Stage1" is supplied with the first conversion result "1" through the flip-flop circuit 108. The node b2 in the second stage "Stage2" is supplied with a digital signal of "0", so that a select signal of "10" is supplied to the selector 104 in the last stage "Stage3". Therefore, the reference voltage signal VREF6=1.25V is selected and supplied to the comparator 106 in the last stage "Stage3". The comparator 106 compares voltage 1.3V at the node a3 with voltage 1.25V at a node v3, and supplies a digital output signal b3 of "1". As a result, a digital output signal of whole the A/D converter 100 is determined to be "101".

In the above-described case, after one and half (1.5) cycles since an analog input signal VIN is sampled in the first stage "Stage1", a corresponding digital output signal is obtained. The detailed timings of operation for this case are shown in FIGS. 5 to 8.

As described above, according to the first preferred embodiment, the common analog input signal VIN is sampled and held by the S/H circuit in the every stage. The reference voltage signal is selected in accordance with a comparison result in the preceding stage. The analog input signal VIN and comparison result are supplied in pipeline fashion to the following stage, and A/D converting process is carried out continuously. A/D converting process is carried out at a cycle that is 1/N that of a successive approximation A/D converter. Further, no 2× (double) amplifier is used, so that the circuitry can be designed small in size and scale.

Figure 9:
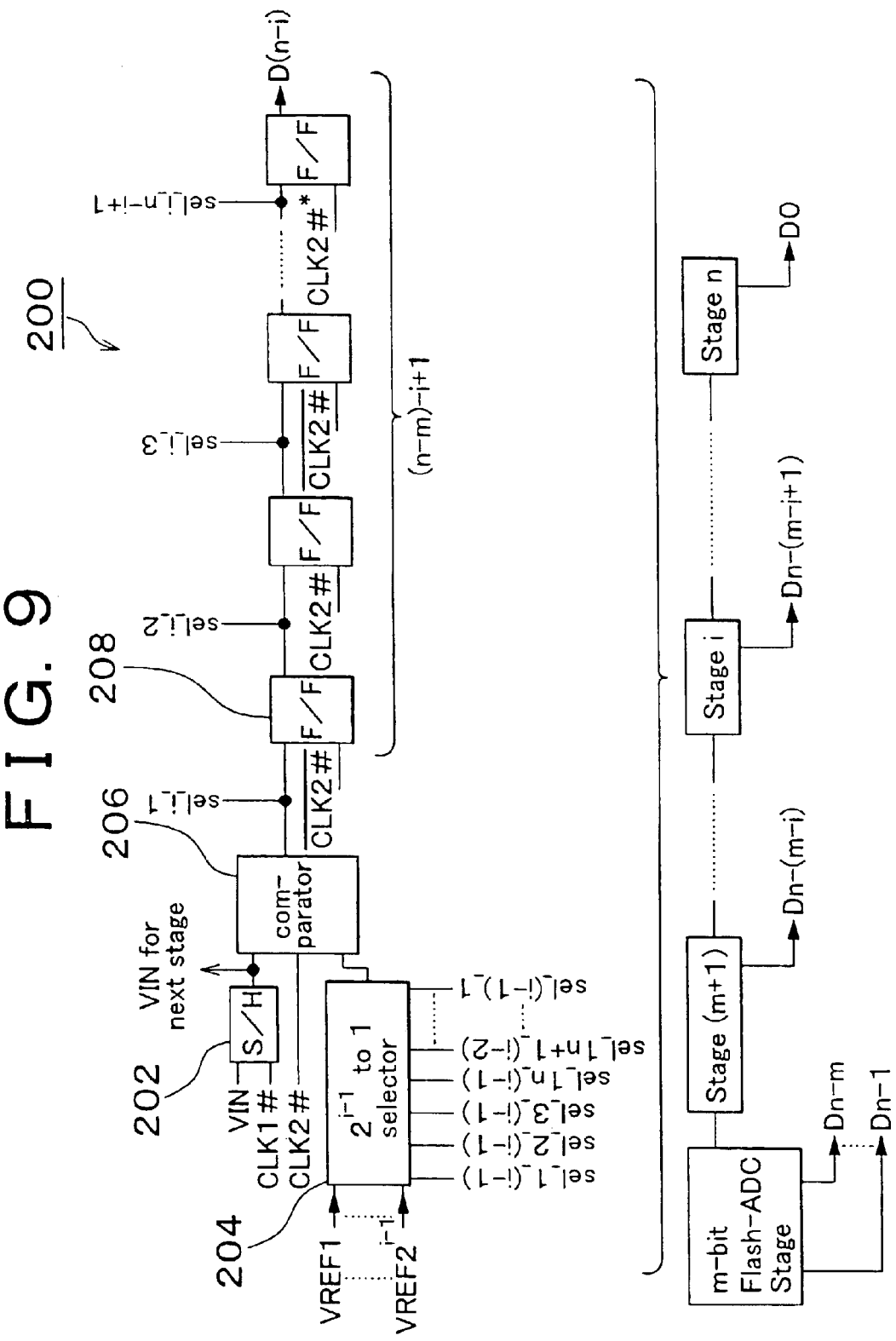
FIG. 9 is a block diagram showing an A/D converter according to a second preferred embodiment of the present invention.

FIG. 9 is a block diagram showing an A/D converter 200 according to a second preferred embodiment of the present invention. The A/D converter 200 includes first to $N_{th}$ stages of A/D conversion units, which are connected in series, each A/D conversion unit converting an analog input signal VIN into a digital output signal in synchronization with a clock signal CLK1 and CLK2. Each of the second to $N_{th}$ stages of A/D conversion units includes a sample-and-hold (S/H) circuit 202, which samples and holds an analog input signal VIN in synchronization with the clock signal CLK1; a selector 204 which selects one from a plurality of reference voltage signals VREF1 to VREF$2^{i-1}$ in accordance with a digital output signal outputted from the one stage preceding A/D conversion unit; and a comparator 206 which compares an output signal supplied from the S/H circuit 202 with the reference voltage signal selected by the selector 204 to generate a digital output signal thereof.

In $i_{th}$ stage of A/D conversion unit, the selector 204 selects one reference voltage signal from $2^{i-1}$ pieces of reference voltage signals. Each stage of conversion unit also includes serially connected flip-flop circuits 208, which delays an output signal of the comparator 206 by necessary cycles. In $i_{th}$ stage of A/D conversion unit, (N−i+1) pieces of flip-flop circuits are used to which an output signal of the comparator 206 in the one stage preceding A/D conversion unit is supplied. An output signal of the comparator 206 for the one stage preceding A/D conversion unit is supplied to the selector 204 therein. The even-numbered stages of A/D conversion units and odd-numbered stages of A/D conversion units operate in synchronization with clock signals having the opposite phases.

In each stage of conversion unit, the S/H circuit 202 is supplied with the analog input signal VIN and clock signal. CLK1#, and is connected at an output terminal to an input terminal of the comparator 206 and to an input terminal of a S/H circuit (202) in the next stage. The selector 204 is supplied with reference voltage signals VREF1 to VREF$2^{i-1}$ and selections signals sel_1_(i−1) to sel_(i−1)_1, and is connected at an output terminal to an input terminal of the comparator 206. The comparator 206 is supplied with a clock signal CLK#2, and is connected to an input terminal of a first flip-flop circuit 208. Input signals supplied to the flip-flop circuits 208 are used as selecting signals sel_1_ (i−1) to sel_(i−1)_1 for the next stage.

Figure 10:
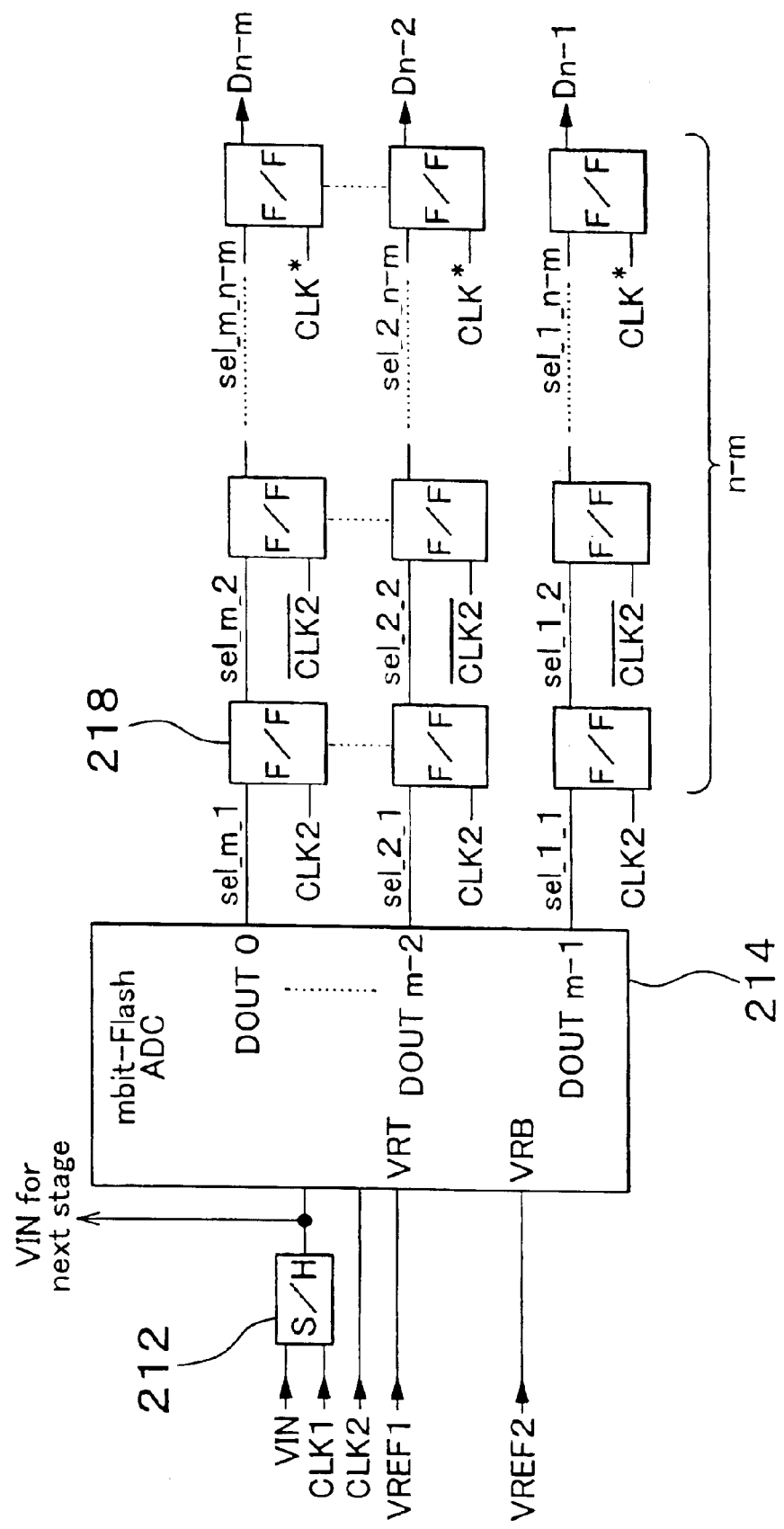
FIG. 10 is a block diagram showing a flash ADC used in the second preferred embodiment.

The A/D converter 200 also includes at the first stage a flash A/D conversion unit of m-bit flash type, where "m" is smaller than "N". As shown in FIG. 10, the flash A/D conversion unit includes a m-bit flash A/D conversion circuit 214; a sample-and-hold (S/H) circuit 212 which holds an analog input signal VIN; and m*(N−m) pieces of flip-flop circuits 218, in which each of serially connected (N−m) pieces of flip-flop circuits form a line so that "m" lines of (N−m) flip-flop circuits are connected in parallel to output terminals of the m-bit flash A/D conversion circuit 214. In each line of the flip-flop circuits, an input signal supplied to a first flip-flop circuit is also supplied to input terminals of selectors in A/D conversion units in the subsequent stages.

Figure 11:
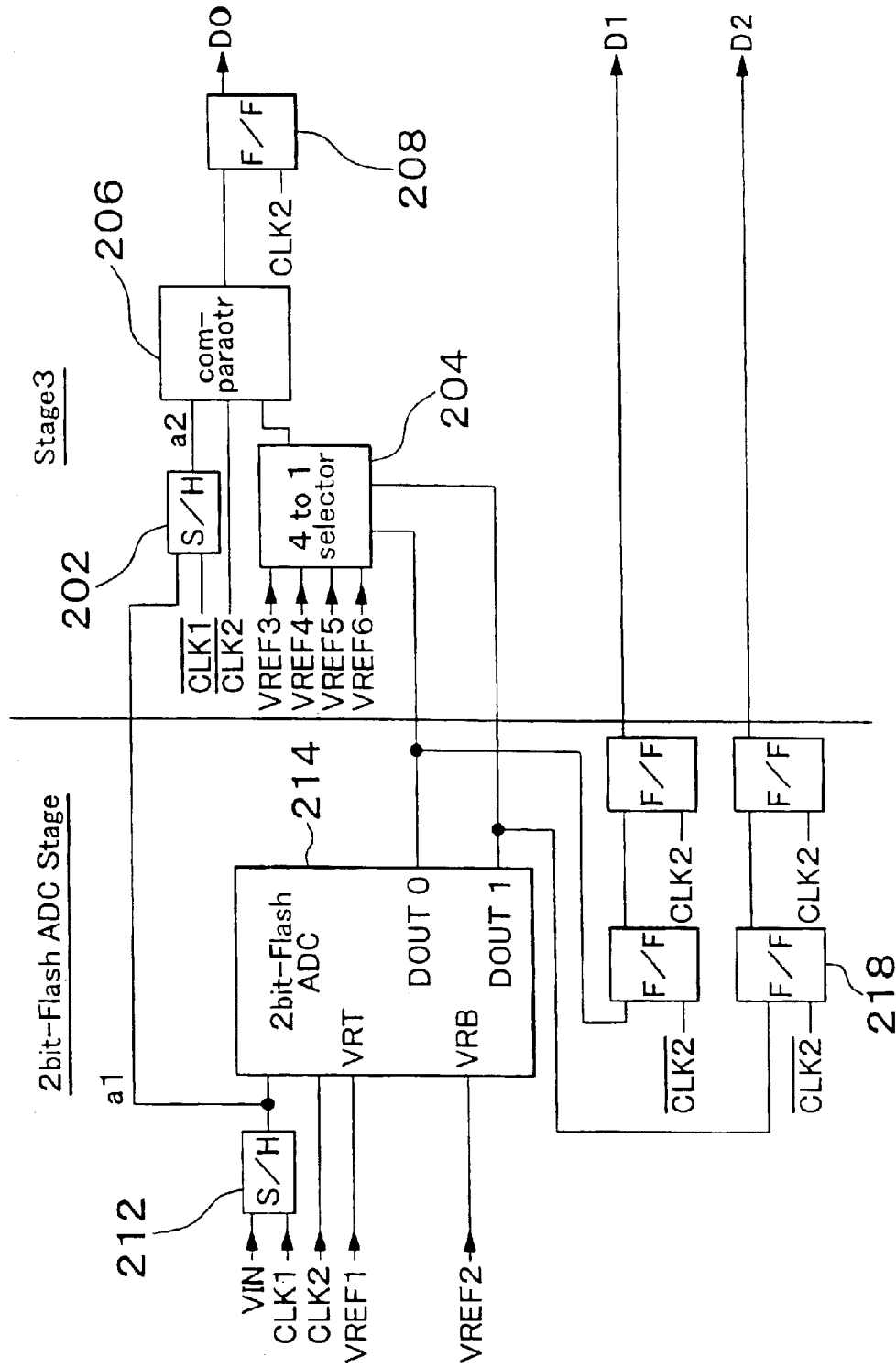
FIG. 11 is a block diagram showing a three-bit type of A/D converter according to the second preferred embodiment.

For easy understanding, the operation of the A/D converter 200 is described assuming that the converter treats three-bit signal (N=3) in reference to FIG. 11. In the following case, the A/D converter 200 has a conversion range 0.0V to 2.0V. First in the first stage "Stage1", an analog input signal VIN (=1.3V) is sampled and held by the S/H circuit 202 at a rising point of the clock signal CLK1, so that a node a1 is maintained at 1.3V. The 2 bit-Flash ADC 214 is supplied at input terminals VRT and VRB with reference voltage signals VREF1 '2.0V) and VREF2 (0.0V). The 2 bit-Flash ADC 214 is also supplied with a sampling clock CLK2 and a voltage at a node "a1". The 2 bit-Flash ADC 214 supplies a 2-bit digital output signal DOUT[1:0].

The 2 bit-Flash ADC 214 supplies a digital output signal DOUT of "00" when the analog input signal VIN is in the range between 0.0V and 1.5V. The 2 bit-Flash ADC 214 supplies a digital output signal DOUT of "01" when the analog input signal VIN is in the range between 0.5V and 1.0V. The 2 bit-Flash ADC 214 supplies a digital output signal DOUT of "10" when the analog input signal VIN is in the range between 1.0V and 1.5V. The 2 bit-Flash ADC 214 supplies a digital output signal DOUT of "11" when the analog input signal VIN is in the range between 1.5V and 2.0V. In this case, the analog input signal VIN is 1.3V, so that the 2 bit-Flash ADC 214 supplies a digital output signal DOUT of "10". The digital output signal DOUT is supplied at a rising point of the clock CLK2.

Next, in the stage "Stage3", the S/H circuit 202 samples and holds a voltage (1.3V) at the node a1 in the 2 bit-Flash ADC stage at a dropping point of the clock CLK1. The operation in this step is the same as that of the third stage "Stage3" in the first preferred embodiment. The comparator 206 in the "Stage3" supplies an output signal of "1". At the next rising point of the clock CLK2, output signals of the 2 bit-Flash ADC stage and Stage3 are supplied out through the flip-flop circuits 218. As a result, a digital output signal of whole the A/D converter 100 is determined to be "101". In the above-described case, after one cycle since an analog input signal VIN is first sampled, a corresponding digital output signal is obtained.

As described above, according to the second preferred embodiment of the present invention, m-bit A/D conversion process is carried out at the first stage, so that necessary cycle for obtaining a digital output signal is reduced to (m−1)/2 times relative to the first preferred embodiment. The m-bit flash type A/D conversion circuit can be arranged not only at the first stage but also to any other stage.

What is claimed is:

1. An A/D converter comprising:
a number of stages of A/D conversion units, which are connected in series, each A/D conversion unit converting an analog input signal into a digital output signal in synchronization with a clock signal, wherein
the first stage of the A/D conversion units is a flash A/D conversion unit of m-bit flash type, where "m" is smaller than "N", in which the flash A/D conversion unit comprises an m-bit flash A/D conversion circuit; a first sample-and-hold circuit which holds an analog input signal; and m*(N−m) flip-flop circuits, in which each of serially connected (N−m) flip-flop circuits form a line so that "m" lines of the (N−m) flip-flop circuits are connected in parallel to output terminals of the m-bit flash A/D conversion circuit, each of (N−m) stages of the A/D conversion units except the first stage of the A/D conversion units comprises a) a sample-and-hold circuit, which holds an analog input signal;

b) a selector which selects one of a plurality of reference voltage signals in accordance with a digital output signal outputted from a preceding stage A/D conversion unit; and c) a comparator which compares an output signal supplied from the sample-and-hold circuit with the reference voltage signal selected by the selector to generate a digital output signal thereof, wherein an output signal of the comparator of a preceding stage A/D conversion unit is supplied to the selector therein, even-numbered stages of the A/D conversion units and odd-numbered stages of the A/D conversion units operate in synchronization with clock signals having opposite phases, an $i_{th}$ stage of the A/D conversion units further comprises (N−i+1) flip-flop circuits to which an output signal of the comparator in a preceding stage A/D conversion unit is supplied, and in the $i_{th}$ stage of the A/D conversion units, the selector selects one reference voltage signal from $2^{i-1}$ reference voltage signals.

2. The A/D converter according to claim 1, wherein in the first stage of the A/D conversion units, an input signal supplied to a first flip-flop circuit in each line of the (N−m) flip-flop circuits is supplied to an input terminal of a selector in each of the (N−m) stages of A/D conversion units.

3. The A/D converter according to claim 1, wherein in each of the (N−m) stages of A/D conversion units, a comparison result of the comparator is supplied as a digital output signal thereof.

4. The A/D converter according to claim 1, wherein the $i_{th}$ stage of the A/D conversion units further comprises (N−i+1) flip-flop circuits to which an output signal of the comparator in a preceding stage A/D conversion unit is supplied.

5. The A/D converter according to claim 1, wherein in each of the (N−m) stages of A/D conversion units, an output signal of the comparator for a preceding stage A/D conversion unit is supplied to the selector therein.

6. The A/D converter according to claim 1, wherein even-numbered stages of the A/D conversion units and odd-numbered stages of the A/D conversion units operate in synchronization with clock signals having opposite phases.

7. The A/D converter according to claim 1, wherein in the $i_{th}$ stage of the A/D conversion units, the selector selects one reference voltage signal from $2^{i-1}$ reference voltage signals.

* * * * *